United States Patent
Lin

(10) Patent No.: US 12,205,834 B2
(45) Date of Patent: *Jan. 21, 2025

(54) TEMPERATURE CALIBRATION METHODS FOR SEMICONDUCTOR MACHINE

(71) Applicant: CHANGXIN MEMORY TECHNOLOGIES, INC., Hefei (CN)

(72) Inventor: ShihChieh Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 678 days.

This patent is subject to a terminal disclaimer.

(21) Appl. No.: 17/310,761

(22) PCT Filed: Mar. 10, 2021

(86) PCT No.: PCT/CN2021/079968
§ 371 (c)(1),
(2) Date: Aug. 20, 2021

(87) PCT Pub. No.: WO2021/185133
PCT Pub. Date: Sep. 23, 2021

(65) Prior Publication Data
US 2022/0319883 A1  Oct. 6, 2022

(30) Foreign Application Priority Data
Mar. 19, 2020 (CN) .......................... 202010198897.9

(51) Int. Cl.
*G01K 15/00* (2006.01)
*G01K 7/01* (2006.01)
*H01L 21/67* (2006.01)

(52) U.S. Cl.
CPC .......... *H01L 21/67248* (2013.01); *G01K 7/01* (2013.01); *G01K 15/005* (2013.01)

(58) Field of Classification Search
CPC . H01L 21/627248; G01K 7/01; G01K 15/005
See application file for complete search history.

(56) References Cited

U.S. PATENT DOCUMENTS

| | | | | |
|---|---|---|---|---|
| 4,677,850 A | * | 7/1987 | Miura | G01F 1/6845 |
| | | | | 73/204.15 |
| 5,100,829 A | * | 3/1992 | Fay | H01L 29/7808 |
| | | | | 438/237 |

(Continued)

FOREIGN PATENT DOCUMENTS

| CN | 1956146 B | 8/2011 |
|---|---|---|
| CN | 102221667 A | 10/2011 |

(Continued)

OTHER PUBLICATIONS

17310761_2024-04-18_EP_0908713_A1_H.pdf,Apr. 14, 1999.*

(Continued)

*Primary Examiner* — Gail Kaplan Verbitsky
(74) *Attorney, Agent, or Firm* — Syncoda LLC; Feng Ma

(57) ABSTRACT

The present application provides a temperature calibration method for a semiconductor machine, including following steps: providing at least one temperature calibration sheet, the temperature calibration sheet comprising a transistor having a voltage-temperature characteristic curve corresponding to a set current; placing the temperature calibration sheet in a measurement region of the semiconductor machine; energizing the temperature calibration sheet at an energizing current being the same as the set current, and measuring a voltage of the transistor; and, obtaining a temperature of the transistor according to the voltage-temperature characteristic curve of the transistor by using the voltage as a known parameter, the temperature being a temperature of the measurement region of the semiconductor machine. The accuracy of temperature calibration is (Continued)

greatly improved, the performance of the semiconductor machine and the yield of the semiconductor manufacturing process are also improved.

13 Claims, 4 Drawing Sheets

(56) References Cited

U.S. PATENT DOCUMENTS

| | | | |
|---|---|---|---|
| 5,435,646 | A | 7/1995 | McArthur et al. |
| 6,164,816 | A | 12/2000 | Aderhold et al. |
| 6,190,040 | B1 * | 2/2001 | Renken ............ H01L 21/67248 374/E1.019 |
| 7,492,176 | B2 | 2/2009 | Chiba et al. |
| 10,366,867 | B2 | 7/2019 | Criminale et al. |
| 11,852,542 | B2 * | 12/2023 | Qian ...................... H01L 22/12 |
| 2001/0012639 | A1 * | 8/2001 | Akram ................... G01K 1/026 438/18 |
| 2007/0075797 | A1 | 4/2007 | Matsuya et al. |
| 2007/0158575 | A1 * | 7/2007 | Heismann ............... G01T 1/244 250/370.15 |
| 2008/0002757 | A1 * | 1/2008 | Kosta .................... G01K 7/425 374/170 |
| 2010/0066433 | A1 | 3/2010 | Mochizuki |
| 2011/0001502 | A1 | 1/2011 | Walker |
| 2011/0252984 | A1 * | 10/2011 | Chung ................... H05K 1/141 374/178 |
| 2015/0276487 | A1 * | 10/2015 | Krampert ............. G01J 5/0007 250/338.3 |
| 2019/0331535 | A1 | 10/2019 | Zhuang |

FOREIGN PATENT DOCUMENTS

| | | | | |
|---|---|---|---|---|
| CN | 202075059 | U | 12/2011 | |
| CN | 103050423 | A | 4/2013 | |
| CN | 103280413 | A | 9/2013 | |
| CN | 103698056 | A | 4/2014 | |
| CN | 103808425 | A | 5/2014 | |
| CN | 104051298 | A | 9/2014 | |
| CN | 105097421 | A | 11/2015 | |
| CN | 106501699 | A | 3/2017 | |
| CN | 106505018 | A | 3/2017 | |
| CN | 106771942 | A | 5/2017 | |
| CN | 107091697 | A | 8/2017 | |
| CN | 107331595 | A * | 11/2017 | ............ H01J 37/32 |
| CN | 108803260 | A | 11/2018 | |
| CN | 109084911 | A | 12/2018 | |
| CN | 109186790 | A | 1/2019 | |
| CN | 109443600 | A | 3/2019 | |
| CN | 109540961 | A | 3/2019 | |
| CN | 109659244 | A | 4/2019 | |
| CN | 110085531 | A | 8/2019 | |
| CN | 110274705 | A | 9/2019 | |
| CN | 110600419 | A | 12/2019 | |
| CN | 110888470 | A | 3/2020 | |
| DE | 102019111696 | A1 * | 11/2020 | |
| EP | 0908713 | A1 * | 4/1999 | |
| JP | 61154086 | A * | 7/1986 | |
| JP | 2003077816 | A * | 3/2003 | |
| JP | 2007536726 | A * | 12/2007 | |
| JP | 2012256799 | A | 12/2012 | |
| JP | 2014190801 | A | 10/2014 | |
| KR | 19980070520 | A * | 10/1998 | |
| KR | 20160071453 | A * | 6/2016 | |
| SU | 823898 | A1 * | 4/1981 | |
| TW | 421832 | B | 2/2001 | |
| TW | M528516 | U | 9/2016 | |
| WO | WO-9607086 | A1 * | 3/1996 | ............ G01K 13/00 |
| WO | WO-0068979 | A2 * | 11/2000 | ............ G01K 1/026 |
| WO | 2018086666 | A1 | 5/2018 | |
| WO | 2020033304 | A1 | 2/2020 | |

OTHER PUBLICATIONS

17310761_2024-04-18_JP_61154086_A_H.pdf,Jul. 12, 1986.*
17310761_2024-04-18_SU_823898_A1_H.pdf,Apr. 23, 1981.*
17310761_2024-04-18_WO_0068979_A2_H.pdf,Nov. 16, 2000.*
17310761_2024-04-22_DE_102019111696_A1_H.pdf,Nov. 12, 2020.*
17310761_2024-04-22_KR_19980070520_A_H.pdf,Oct. 26, 1998.*
17310761_2024-04-22_WO_9607086_A1_H.pdf,Mar. 7, 1996.*
17310761_2024-08-28_KR_20160071453_A_H.pdf,Jun. 21, 2016.*
17310761_2024-08-28_JP_2003077816_A_H.pdf,Mar. 14, 2003.*
17310761_2024-08-28_CN_107331595_A_H.pdf,Nov. 7, 2017.*
International Search Report in Application No. PCT/CN2021/079968 mailed on May 27, 2021.
1st Office Action (CNOA1) in Application No. CN 202010196026.3 mailed on Apr. 22, 2022.
International Search Report in Application No. PCT/CN2021/079969, mailed on Jun. 10, 2021.
CN First Office Action in Application No. 202010196028.2, mailed on Feb. 14, 2022.
International Search Report in Application No. PCT/CN2021/080389, mailed on May 8, 2021.
International Search Report in Application No. PCT/CN2021/080352, mailed on Jun. 23, 2021.

* cited by examiner

```
┌─────────────────────────────────────────────────────────────────────┐
│ Provide at least one temperature calibration sheet, the temperature │─── S10
│ calibration sheet comprising a transistor having a voltage-          │
│ temperature characteristic curve corresponding to a set current      │
└─────────────────────────────────────────────────────────────────────┘
                                    │
┌─────────────────────────────────────────────────────────────────────┐
│ Place the temperature calibration sheet in a measurement region of   │─── S11
│ the semiconductor machine                                            │
└─────────────────────────────────────────────────────────────────────┘
                                    │
┌─────────────────────────────────────────────────────────────────────┐
│ Energize the temperature calibration sheet at an energizing current  │─── S12
│ being the same as the set current, and measure a voltage of the      │
│ transistor                                                           │
└─────────────────────────────────────────────────────────────────────┘
                                    │
┌─────────────────────────────────────────────────────────────────────┐
│ Obtain a temperature of the transistor according to the voltage-     │
│ temperature characteristic curve of the transistor by using the      │─── S13
│ voltage as a known parameter, the temperature being a temperature    │
│ of the measurement region of the semiconductor machine               │
└─────────────────────────────────────────────────────────────────────┘
```

FIG. 1

TEMPERATURE CALIBRATION METHODS FOR SEMICONDUCTOR MACHINE

CROSS-REFERENCE TO RELATED APPLICATIONS

This application is a national stage of International Application No. PCT/CN2021/079968 filed on Mar. 10, 2021, which claims priority to Chinese Patent Application No. 202010198897.9 filed on Mar. 19, 2020. The disclosures of these applications are hereby incorporated by reference in their entirety.

TECHNICAL FIELD

The present application relates to the field of semiconductor manufacturing, and in particular, to temperature calibration method for semiconductor machine.

BACKGROUND

In the semiconductor manufacturing process, it is usually necessary to perform high-temperature or low-temperature processes on semiconductor machine. The temperature has a great influence on the semiconductor manufacturing process. Particularly for temperature-sensitive processes, the influence from temperature is not ignorable. Therefore, it is very important to calibrate the temperature of the machine.

Existing temperature calibration methods for semiconductor machine are to place a plurality of temperature calibrators (e.g., five or nine temperature calibrators) on the semiconductor machine to calibrate the temperature of the semiconductor machine, so as to ensure that the temperature of the semiconductor machine reaches a set temperature and the wafer has a consistent temperature in various parts of the semiconductor machine. The existing temperature calibrators are usually sensors, with the disadvantage that the temperature calibration is low in accuracy and cannot satisfy the requirements.

Therefore, there is an urgent need for a high-accuracy temperature calibration method for semiconductor machine.

SUMMARY

The technical problem to be solved by the present application is to provide a calibration method for semiconductor machine.

In order to solve the problem mentioned above, the present application provides a temperature calibration method for semiconductor machine, comprising following steps: providing at least one temperature calibration sheet, the temperature calibration sheet comprising a transistor having a voltage-temperature characteristic curve corresponding to a set current; placing the temperature calibration sheet in a measurement region of the semiconductor machine; energizing the temperature calibration sheet at an energizing current being the same as the set current, and measuring a voltage of the transistor; and, obtaining a temperature of the transistor according to the voltage-temperature characteristic curve of the transistor by using the voltage as a known parameter, the temperature being a temperature of the measurement region of the semiconductor machine.

Further, a method for obtaining the voltage-temperature characteristic curve of the transistor comprises following steps: obtaining current-voltage curves of the transistor at a plurality of set temperatures, one set temperature corresponding to one current-voltage curve; obtaining, from each of the current-voltage curves, voltage values corresponding to the set current; and, drawing the voltage-temperature characteristic curve by using the voltage values and the corresponding set temperatures as parameters.

Further, the transistor is a bipolar junction transistor.

Further, a method for obtaining current-voltage curves of the transistor at a plurality of set temperatures comprises following steps: applying a plurality of emitter junction voltages to the transistor at one set temperature to obtain base currents and collector currents corresponding to the emitter junction voltages; summing the base current and the collector current corresponding to the same emitter junction voltage to serve as an emitter current corresponding to this emitter junction voltage; drawing the current-voltage curve by using the emitter currents and the emitter junction voltages as parameters to obtain the current-voltage current corresponding to the set temperature; and, repeating the above steps to obtain current-voltage currents corresponding to the plurality of set temperatures.

Further, the bipolar junction transistor is a PNP-type transistor, and the value range of the emitter junction voltages is −1.2 V to −0.5 V.

Further, the bipolar junction transistor is an NPN-type transistor, and the value range of the emitter junction voltages is 0.5 V to 1.2 V.

Further, the method for selecting the set current is as follows: selecting a current in a linear region of the current-voltage curve as the set current.

Further, the value range of the set temperatures is −40° C. to 150° C.

Further, the voltage-temperature characteristic curve is a linear function curve and has a theoretical slope value; the actual slope value of the drawn voltage-temperature characteristic curve is compared with the theoretical slope value; and, the voltage value is obtained again, and the voltage-temperature characteristic curve is drawn again, if the difference between the actual slope value and the theoretical slope value is greater than a preset value.

Further, before each temperature calibration of the semiconductor machine, the voltage-temperature characteristic curve corresponding to the set current is obtained.

Further, the temperature calibration method further comprises following steps: providing a wafer; and, cutting the wafer to obtain the temperature calibration sheet.

Further, the temperature calibration sheet is energized after it is placed in the measurement region of the semiconductor machine for some time.

Further, the temperature calibration method further comprises following steps: in the step of providing at least one temperature calibration sheet, obtaining a function of voltage and temperature according to the voltage-temperature characteristic curve of the transistor; and, in the step of obtaining a temperature of the transistor according to the voltage-temperature characteristic curve of the transistor, obtaining the temperature of the transistor according to the function of voltage and temperature.

The present application has the following advantages: by obtaining the temperature of the semiconductor machine by using the voltage-temperature characteristic curve of the transistor, the accuracy of temperature calibration is greatly improved, the performance of the semiconductor machine is further improved, and the yield of the semiconductor manufacturing process is improved.

BRIEF DESCRIPTION OF THE DRAWINGS

In order to describe the technical solutions in the embodiments of the present application more clearly, the drawings to be used in the embodiments of the present application will be briefly described below. Apparently, the drawings to be used in the following description show only some embodiments of the present application. For a person of ordinary skill in the art, other drawings may be obtained according to these drawings, without paying any creative effort.

FIG. 1 is a schematic step diagram of an embodiment of a temperature calibration method for semiconductor machine according to the present application;

DETAILED DESCRIPTION

Figure 2:
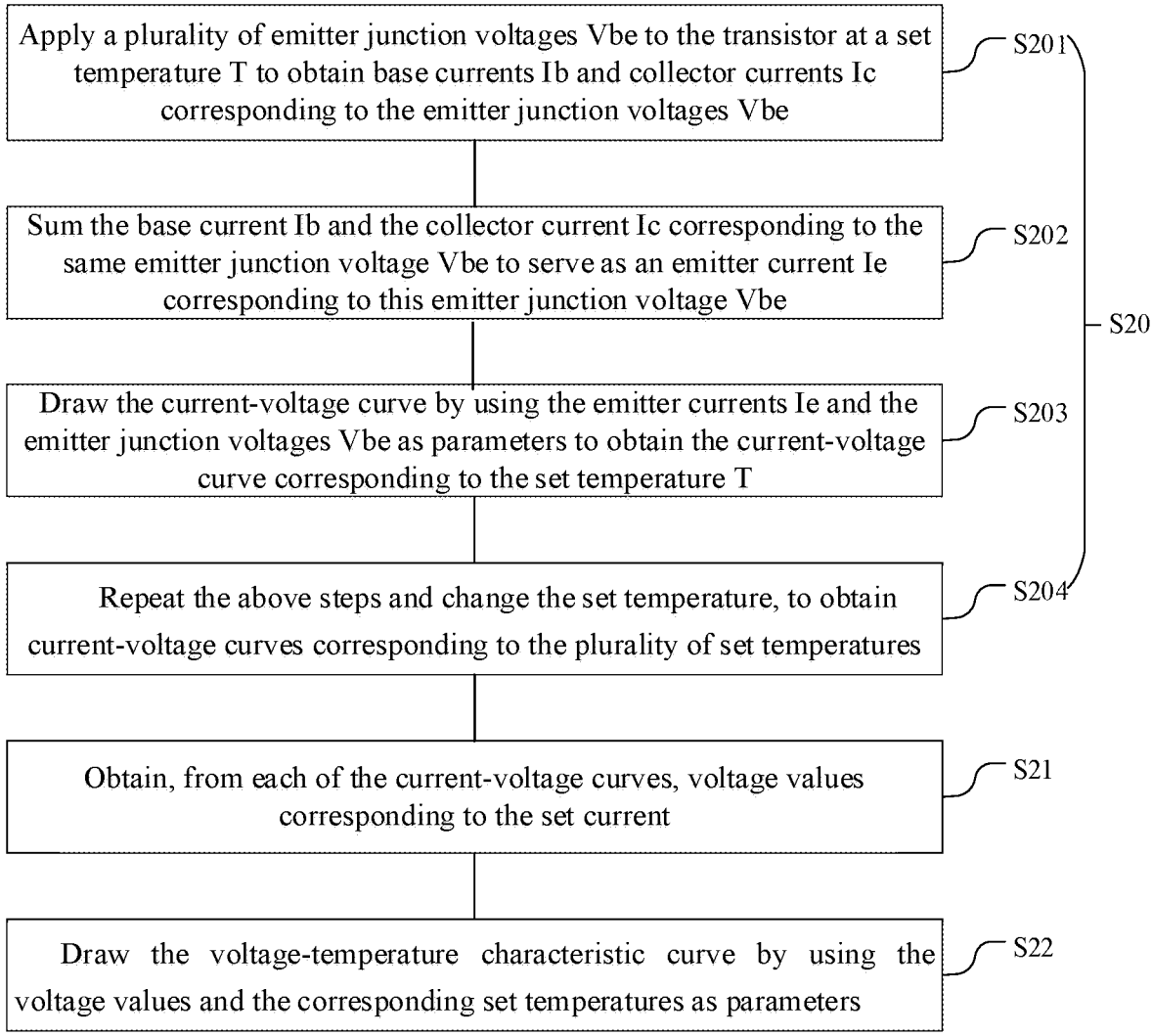
FIG. 2 is a schematic step diagram of a method for obtaining the voltage-temperature characteristic curve of the transistor in the temperature calibration method for semiconductor machine according to the present application.

In order to make the objectives, technical means and effects of the present application clearer, the present application will be further explained below with reference to the drawings. It should be understood that the embodiments to be described herein are only some but not all of the embodiments of the present application, and are not intended to limit the present application. All other embodiments obtained on the basis of the embodiments in the present application by those skilled in the art without paying any creative effort shall fall into the protection scope of the present application.

FIG. 1 is a schematic step diagram of an embodiment of a temperature calibration method for semiconductor machine according to the present application. Referring to FIG. 1, the temperature calibration method comprises following steps.

S10: At least one temperature calibration sheet is provided, the temperature calibration sheet comprising a transistor having a voltage-temperature characteristic curve corresponding to a set current. It should be understood that the voltage-temperature characteristic curves corresponding to different set currents may be different.

Further, in this embodiment, the temperature calibration sheet mat be formed by cutting a wafer. Specifically, a complete wafer is provided, and a plurality of transistors are provided on the wafer. The wafer is cut to obtain a plurality of temperature calibration sheets, each of which has a transistor. The temperature calibration sheet is formed by directly cutting the wafer, so the wafer may be prepared by a semiconductor manufacturing process, without additional semiconductor manufacturing processes, patterns or the like for producing the calibration temperature sheet, so that the labor, material resource and production cost are saved.

In this embodiment, the transistor is a bipolar junction transistor (BJT). The method for obtaining the voltage-temperature characteristic curve comprises following steps, with reference to FIG. 2.

S20: Current-voltage curves of the transistor at a plurality of set temperatures are acquired, one set temperature corresponding to one current-voltage curve. In this step, the current-voltage curves corresponding to different set temperatures may be different. Therefore, a plurality of set temperatures correspond to a plurality of current-voltage curves. For example, the set temperature T1 corresponds to one current-voltage curve, the set temperature T2 corresponds to one current-voltage curve, the set temperature T3 corresponds to one current-voltage curve, and the like.

Further, for the bipolar junction transistor, S20 further comprises following steps.

S201: A plurality of emitter junction voltages Vbe are applied to the transistor at a set temperature T to obtain base currents Ib and collector currents Ic corresponding to the emitter junction voltages Vbe. One emitter junction voltage Vbe corresponds to one base current Ib and one collector current Ic, and a plurality of emitter junction voltages Vbe correspond to a plurality of base currents Ib and collector currents Ic.

In this embodiment, an emitter junction voltage Vbe-base current Ib curve and an emitter junction voltage Vbe-collector current Ic curve are drawn by using the emitter junction voltages Vbe, the base currents Ib and the collector currents Ic as parameters, wherein the emitter junction voltages Vbe are used as horizontal coordinates, and the base currents Ib and the collector currents Ic are used as vertical coordinates. In other embodiments of the present application, it is also possible make a data table by using the emitter junction voltages Vbe, the base currents Ib and the collector currents Ic as parameters.

Further, in order to obtain sufficient data, if the bipolar junction transistor is a PNP-type transistor, the value range of the emitter junction voltages is −1.2 V to −0.5 V; and, if the bipolar junction transistor is an NPN-type transistor, the value range of the emitter junction voltages is 0.5 V to 1.2 V.

S202: The base current Ib and the collector current Ic corresponding to the same emitter voltage Vbe are summed as an emitter current Ie corresponding to this emitter voltage Vbe. For the bipolar junction transistor, since the sum of the base current Ib and the collector current Ic is the emitter current Ie, in this step, the base current Ib and the collector current Ic corresponding to the same emitter voltage Vbe are summed to obtain the emitter current Ie.

Specifically, in this embodiment, the same emitter junction voltage Vbe is selected on the emitter junction voltage Vbe-base current Ib curve and the emitter junction voltage Vbe-collector current Ic curve, and the base current Ib and the collector current Ic corresponding to this emitter junction voltage Vbe are added to obtain the emitter current Ie corresponding to the emitter junction voltage Vbe. In another embodiment of the present application, it is also possible that the base current Ib and the collector current Ic corresponding to the same emitter junction voltage Vbe are obtained from the data table of the emitter junction voltages Vbe, the base currents Ib and the collector currents Ic and then summed to obtain the emitter current Ie corresponding to the emitter junction voltage Vbe.

In S202, multiple pairs of parameters are obtained, each pair of parameters comprising the emitter junction voltage Vbe and the corresponding emitter current Ie.

S203: The current-voltage curve is drawn by using the emitter currents Ie and the emitter junction voltages Vbe as parameters to obtain the current-voltage current corresponding to the set temperature T.

Figure 3:
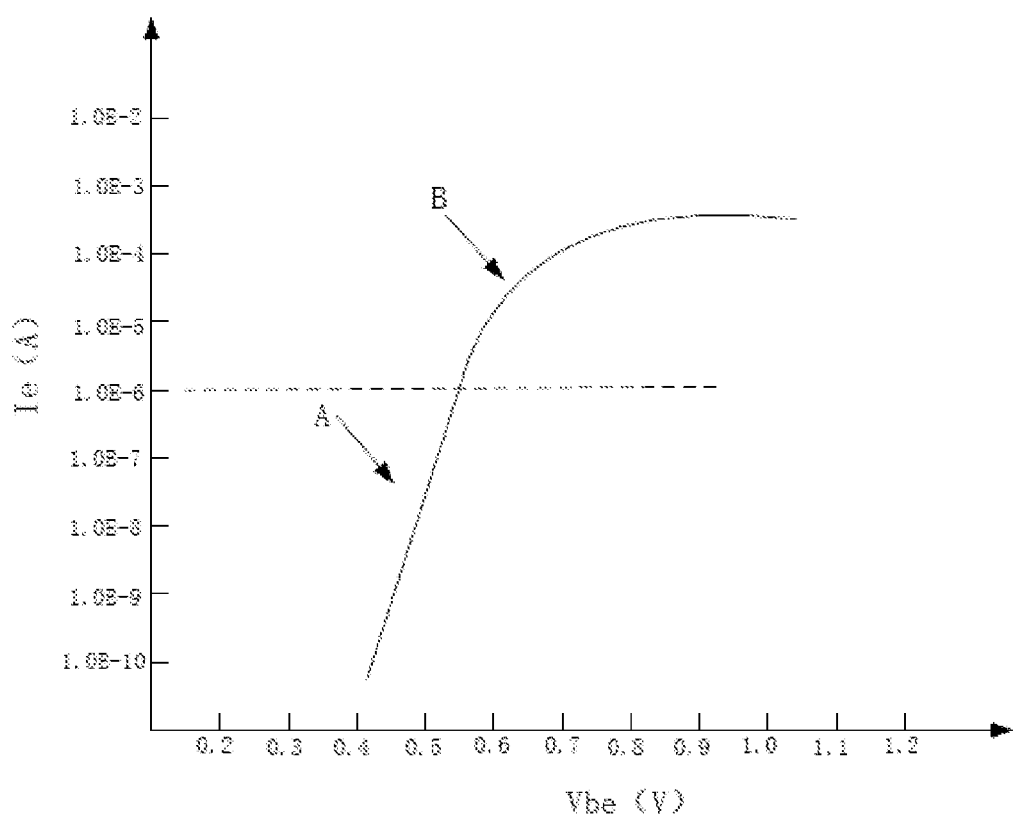
FIG. 3 is the current-voltage curve corresponding to the set temperature in the temperature calibration method for semiconductor machine according to the present application.

In this step, the current-voltage current corresponding to the set temperature T is drawn by using the multiple pairs of parameters obtained in S202. FIG. 3 is the current-voltage curve corresponding to the set temperature T. For the PNP-type transistor, the value range of the emitter junction voltages Vbe is negative values, so the formed current-voltage curve shown in FIG. 3 is inconvenient for observation. Therefore, the current-voltage curve is usually symmetrized by using the Y-axis as an axis of symmetry to form a curve where the emitter junction voltages Vbe are positive values for easy observation. Referring to FIG. 3, in the current-voltage current corresponding to the set temperature T, the horizontal coordinates are the emitter junction voltages Vbe, and the vertical coordinates are the emitter currents Ie.

S204: The above steps are repeated and the set temperature is changed to obtain current-voltage curves corresponding to a plurality of set temperatures.

Further, in this embodiment, the value range of the set temperatures is −40° C. to 150° C. It should be understood that, the set temperature may be selected according to the actual process temperature of the semiconductor machine, thereby providing more accurate temperature calibration.

Continuously referring to FIG. 2, in S21, voltage values corresponding to the set current are acquired from the current-voltage curves.

Since a plurality of current-voltage curves are obtained in S20, in this step, a set current is selected, and an emitter junction voltage Vbe corresponding to the set current is obtained from each current-voltage curve by using the set current as a known parameter. As shown in FIG. 3, if the current 1.0E-6 is used as the set current, an emitter junction voltage Vbe corresponding to the set current 1.0E-6 is obtained from each current-voltage curve. Since each current-voltage curve corresponds to only one set temperature, the data of the set temperature and the corresponding emitter junction voltage Vbe can be obtained. In other words, in this step, multiple pairs of parameters are obtained, each pair of parameter comprising the set temperature and the corresponding emitter junction voltage Vbe.

Further, in this step, the set current is selected based on the following principle: a current in a linear region of the current-voltage curve is selected as the set current. As shown in FIG. 3, the current-voltage curve comprises a linear region A and a nonlinear region B. In the linear region A, the emitter current Ie is less interfered by the outside and is the real value of the emitter current Ie; however, in the nonlinear region B, the emitter current Ie is greatly interfered by the outside and deviates from the real value of the emitter current Ie. Therefore, in order to obtain accurate data, it is preferable to select, as the set current, a current in the linear region of the current-voltage curve.

S22: The voltage-temperature characteristic curve is drawn by using the voltage values and the corresponding set temperatures as parameters. In this step, the voltage-temperature characteristic curve is drawn by using the emitter junction voltages Vbe obtained in S21 and the corresponding set temperatures as parameters.

Figure 4:
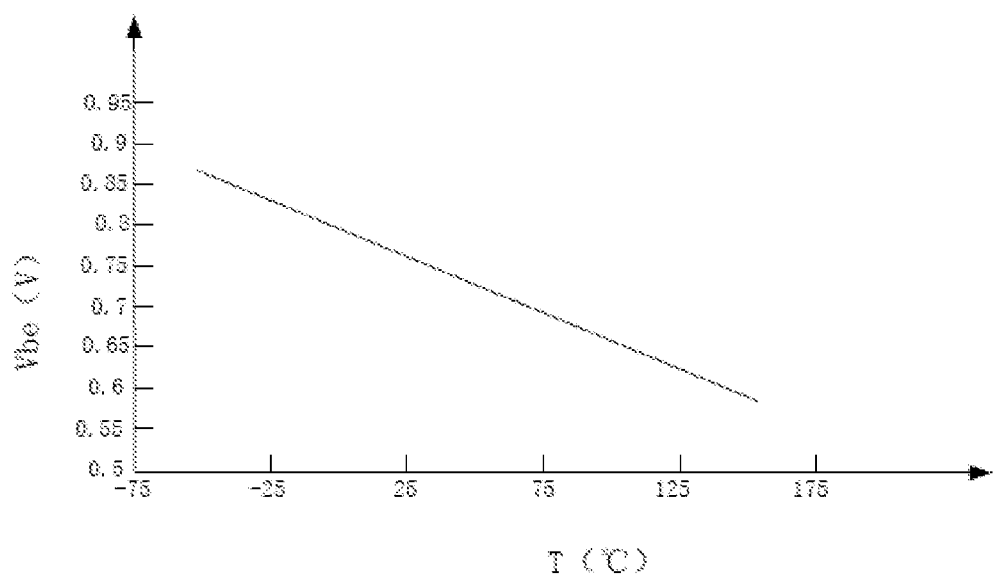
FIG. 4 is the voltage-temperature characteristic curve drawn in the temperature calibration method for semiconductor machine according to the present application.
Figure 5:
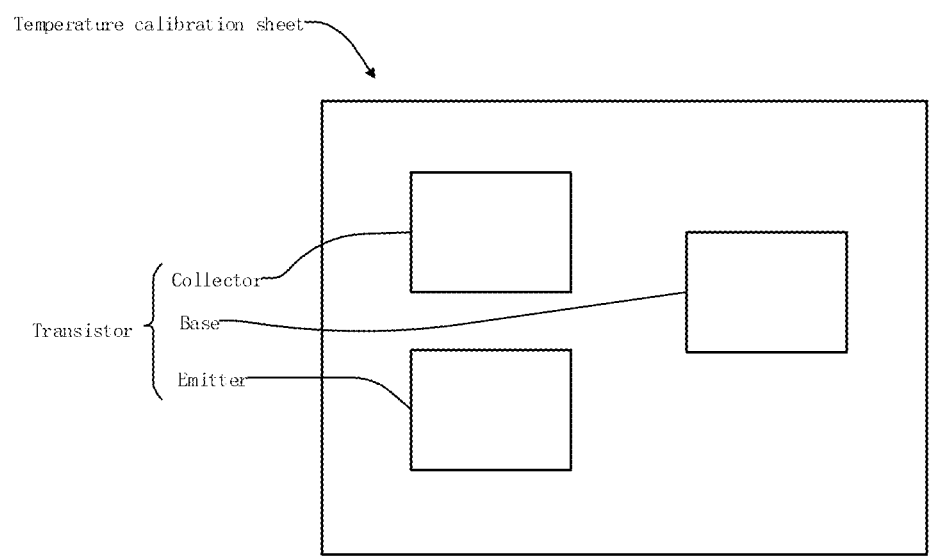
FIG. 5 is a schematic diagram of a temperature calibration sheet according to some embodiments.

FIG. 4 is the drawn voltage-temperature characteristic curve. Referring to FIG. 4, the horizontal coordinates are the set temperatures T, and the vertical coordinates are the emitter junction voltages Vbe. It can be known from FIG. 4 that the voltage-temperature characteristic curve is a linear function.

For a transistor, the voltage-temperature characteristic curve has a theoretical slope value. With the use of the transistor, the transistor will attenuate, and its actual slope value will change but not deviate too much from the theoretical slope value. Therefore, the accuracy of the voltage-temperature characteristic curve can be verified by the theoretical slope value. Specifically, the actual slope value of the drawn voltage-temperature characteristic curve can be compared with the theoretical slope value. If the difference between the actual slope value and the theoretical slope value is greater than a preset value, it indicates that the parameters for drawing the voltage-temperature characteristic curve are wrong or the drawing process is wrong. Therefore, it is necessary to obtain the voltage value again and drawn the voltage-temperature characteristic curve.

Continuously referring to FIG. 1, in S11, the temperature calibration sheet is placed in a measurement region of the semiconductor machine. In this step, a plurality of temperature calibration sheets may be placed in a same measurement region to improve the measurement accuracy. The temperature calibration sheet can be arranged close to the surface of the semiconductor machine.

S12: The temperature calibration sheet is energized at an energizing current that is the same as the set current, and a voltage of the transistor is measured. The energizing current of the temperature calibration is the set current, so the temperature parameter can be obtained by using the voltage-temperature characteristic curve corresponding to the set current in the subsequent steps. In this step, the voltage of the transistor is measured by a probe or other measurement devices. Specifically, in this embodiment, the emitter junction voltage Vbe of the transistor is obtained by a probe or other devices.

Further, the temperature calibration sheet is energized after it is placed in the measurement region of the semiconductor machine for some time, in order to make the temperature calibration sheet have the same temperature as the semiconductor machine and thus improve the measurement accuracy.

S13: A temperature of the transistor is obtained according to the voltage-temperature characteristic curve of the transistor by using the voltage as a known parameter, the temperature being the temperature of the measurement region of the semiconductor machine. Specifically, the temperature of the emitter junction voltage Vbe is obtained from the voltage-temperature characteristic curve by using the emitter junction voltage Vbe obtained in S12 as a known parameter. The temperature is the temperature of the measurement region of the semiconductor machine.

Further, since the transistor will attenuate, the voltage-temperature characteristic curve will change, so that it is necessary to obtain the voltage-temperature characteristic curve corresponding to the set current before each temperature calibration of the semiconductor machine, thereby improving the measurement accuracy. The transistor in the present application is preferably a bipolar junction transistor, which has a large change in voltage and temperature and is stable in performance and slow in attenuation. Therefore, it is unnecessary to obtain the voltage-temperature characteristic curve corresponding to the set current again before each temperature calibration of the semiconductor machine, and the time and cost are thus saved.

In another embodiment of the present application, in S10, a function of voltage and temperature can be obtained according to the voltage-temperature characteristic curve of the transistor; and in S13, the temperature of the transistor is obtained according to the function of voltage and temperature. For example, for a bipolar junction transistor, in one embodiment, in S10, the obtained function of voltage and temperature is y=−0.0015x+0.777, where x is the temperature and y is the voltage. The voltage of the transistor is measured as 0.55235 in S12, and the numerical value 0.55235 is substituted into the function to obtain the temperature 149.77° C. of the semiconductor machine. If there is a difference between the temperature and the set temperature of the semiconductor machine, the actual temperature of the semiconductor machine is allowed to reach the set temperature by adjusting the temperature device of the semiconductor machine.

For the temperature calibration method for semiconductor machine according to the present application, the temperature of the semiconductor machine is calibrated by the characteristics of the transistor, so that the accuracy of temperature calibration is greatly improved. For example, for a high-performance SMU (HRSMU), its voltage resolution of 2 uV is converted into a temperature resolution of 0.02° C.; and, for a high resolution SMU (HRSMU), its voltage resolution of 0.5 uV is converted into a temperature resolution of 0.005° C. Thus, in accordance with the present application, the accuracy of temperature calibration is greatly improved, the performance of the semiconductor machine is further improved, and the yield of the semiconductor manufacturing process is improved.

The above description merely shows the preferred implementations of the present application. It should be noted that for a person of ordinary skill in the art, various improvements and modifications may be made without departing from the principle of the present application, and those improvements and modifications shall also be regarded as falling into the protection scope of the present application.

What is claimed is:

1. A temperature calibration method for a semiconductor machine, comprising following steps:
   presetting an assigned temperature;
   providing at least one temperature calibration sheet, the temperature calibration sheet comprising a transistor having a voltage-temperature characteristic curve corresponding to a set current;
   placing the temperature calibration sheet in a measurement region of the semiconductor machine;
   energizing the temperature calibration sheet at an energizing current being the same as the set current, and measuring a voltage of the transistor;
   obtaining a temperature of the transistor according to the voltage-temperature characteristic curve of the transistor by using the voltage as a known parameter, the temperature being a temperature of the measurement region of the semiconductor machine;
   comparing the temperature with the assigned temperature to get a difference; and
   adjusting a temperature device of the semiconductor machine according to the difference.

2. The temperature calibration method according to claim 1, wherein the voltage-temperature characteristic curve of the transistor is obtained based on following steps:
   obtaining current-voltage curves of the transistor at a plurality of set temperatures, one set temperature corresponding to one current-voltage curve;
   obtaining, from each of the current-voltage curves, voltage values corresponding to the set current; and
   drawing the voltage-temperature characteristic curve by using the voltage values and the corresponding set temperatures as parameters.

3. The temperature calibration method according to claim 2, wherein the transistor is a bipolar junction transistor.

4. The temperature calibration method according to claim 3, wherein, said obtaining current-voltage curves of the transistor at a plurality of set temperatures comprises following steps:
   applying a plurality of emitter junction voltages to the transistor at one set temperature to obtain base currents and collector currents corresponding to the emitter junction voltages;
   summing the base current and the collector current corresponding to the same emitter junction voltage to serve as an emitter current corresponding to this emitter junction voltage;
   drawing the current-voltage curve by using the emitter currents and the emitter junction voltages as parameters to obtain the current-voltage curve corresponding to the set temperature; and
   repeating the above steps to obtain current-voltage curves corresponding to the plurality of set temperatures.

5. The temperature calibration method according to claim 4, wherein the bipolar junction transistor is a PNP-type transistor, and the value range of the emitter junction voltages is −1.2 V to −0.5 V.

6. The temperature calibration method according to claim 4, wherein the bipolar junction transistor is an NPN-type transistor, and the value range of the emitter junction voltages is 0.5 V to 1.2 V.

7. The temperature calibration method according to claim 2, wherein the set current is selected based on: selecting a current in a linear region of the current-voltage curve as the set current.

8. The temperature calibration method according to claim 2, wherein a value range of the set temperatures is −40° C. to 150° C.

9. The temperature calibration method according to claim 2, wherein the voltage-temperature characteristic curve is a linear function curve and has a theoretical slope value; the actual slope value of the drawn voltage-temperature characteristic curve is compared with the theoretical slope value; and
   the voltage value is obtained again, and the voltage-temperature characteristic curve is drawn again, if the difference between the actual slope value and the theoretical slope value is greater than a preset value.

10. The temperature calibration method according to claim 1, wherein prior to each temperature calibration of the semiconductor machine, the voltage-temperature characteristic curve corresponding to the set current is obtained.

11. The temperature calibration method according to claim 1, further comprising following steps:
    providing a wafer; and
    cutting the wafer to obtain the temperature calibration sheet.

12. The temperature calibration method according to claim 1, wherein the temperature calibration sheet is energized after it is placed in the measurement region of the semiconductor machine for some time.

13. The temperature calibration method according to claim 1, further comprising following steps:
    in the step of providing at least one temperature calibration sheet, obtaining a function of voltage and temperature according to the voltage-temperature characteristic curve of the transistor; and
    in the step of obtaining a temperature of the transistor according to the voltage-temperature characteristic curve of the transistor, obtaining the temperature of the transistor according to the function of voltage and temperature.

* * * * *